United States Patent
Cao (10) Patent No.: US 10,802,309 B2
(45) Date of Patent: Oct. 13, 2020

(54) FLEXIBLE ARRAY SUBSTRATE, LIQUID CRYSTAL DISPLAY PANEL, AND LIQUID CRYSTAL DISPLAY

(71) Applicant: Shenzhen China Star Optoelectronics Semiconductor Display Technology Co., Ltd., Shenzhen, Guangdong (CN)

(72) Inventor: Wu Cao, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 16/217,035

(22) Filed: Dec. 11, 2018

(65) Prior Publication Data

US 2019/0324312 A1 Oct. 24, 2019

Related U.S. Application Data

(63) Continuation of application No. PCT/CN2018/087747, filed on May 22, 2018.

(30) Foreign Application Priority Data

Apr. 24, 2018 (CN) .......................... 2018 1 0374734

(51) Int. Cl.
*G02F 1/1333* (2006.01)
*G02F 1/1335* (2006.01)
*G02F 1/1362* (2006.01)
*G02F 1/1339* (2006.01)

(52) U.S. Cl.
CPC .... *G02F 1/133305* (2013.01); *G02F 1/13394* (2013.01); *G02F 1/133512* (2013.01); *G02F 1/133514* (2013.01); *G02F 1/136286* (2013.01); *G02F 2001/13398* (2013.01)

(58) Field of Classification Search
CPC ........... G02F 1/133512; G02F 1/13394; G02F 1/1339; G02F 2001/13398
See application file for complete search history.

(56) References Cited

U.S. PATENT DOCUMENTS

| | | | |
|---|---|---|---|
| 4,904,056 A * | 2/1990 | Castleberry | G02F 1/133512 349/110 |
| 2003/0112405 A1 | 6/2003 | Kim et al. | |
| 2008/0111965 A1* | 5/2008 | Tomita | G02F 1/133305 349/156 |
| 2010/0302497 A1* | 12/2010 | Chang | G02F 1/13394 349/156 |
| 2011/0102697 A1* | 5/2011 | Koyama | G02F 1/13454 349/43 |

FOREIGN PATENT DOCUMENTS

| | | |
|---|---|---|
| CN | 106094360 A | 11/2016 |
| CN | 107741669 A | 2/2018 |

* cited by examiner

*Primary Examiner* — Jessica M Merlin (57) ABSTRACT

The flexible liquid crystal display panel include an upper substrate, a lower substrate and a liquid crystal layer; a plurality of sub-pixel regions are disposed on the lower substrate, and a retaining wall may be disposed around the sub-pixel region, and the retaining wall may define notches to allow the plurality of sub-pixel regions to be located the liquid crystals circulate when the flexible liquid crystal display panels are bent. In the above manner, the present application can ensure the uniformity of diffusion of the alignment liquid and the liquid crystal in the alignment liquid coating and liquid crystal filling processes.

18 Claims, 5 Drawing Sheets

FLEXIBLE ARRAY SUBSTRATE, LIQUID CRYSTAL DISPLAY PANEL, AND LIQUID CRYSTAL DISPLAY

CROSS-REFERENCE TO RELATED APPLICATIONS

The present application is a continuation-application of International (PCT) Patent Application No. PCT/CN2018/087747 filed on May 22, 2018, which claims foreign priority of Chinese Patent Application No. 201810374734.4, filed on Apr. 24, 2018 in the State Intellectual Property Office of China, the entire contents of which are hereby incorporated by reference.

TECHNICAL FIELD

The present application relates to the field of display technology, and in particular, to a flexible array substrate, a flexible liquid crystal display panel, and a flexible liquid crystal display.

BACKGROUND

The flexible display panel is a bendable and deformable display panel or display screen made of flexible material, which has the advantages of low power consumption, small size, light weight, simple installation, convenient transportation, various display modes and excellent display quality. It is widely used in portable electronic devices and touch input devices.

SUMMARY

The present application may provide a flexible array substrate, a flexible liquid crystal display panel, and a flexible liquid crystal display, which can ensure uniformity of diffusion of the alignment liquid and the liquid crystal in the alignment liquid coating and liquid crystal filling processes. When the flexible liquid crystal display panel is pressed and bent, the liquid crystal molecules may be easy to adjust the diffusion by themselves to ensure better display quality.

To solve the above-mentioned problem, a technical scheme adopted by the present disclosure is to provide a flexible array substrate. The flexible array substrate may include a base substrate, and a TFT structure, a protective layer and a pixel electrode layer, which are sequentially disposed on the base substrate. The TFT structure may include a thin film transistor, scan lines and data lines, the scan lines and the data lines are electrically connected to the corresponding thin film transistors. A plurality of scan lines and data lines are cross-arranged to form a plurality of sub-pixel regions, and a retaining wall is disposed around the sub-pixel region; the retaining wall may be disposed along the scan lines and/or the data lines, and the retaining wall may define at least one notch. The plurality of sub-pixel regions are connected to each other; wherein the retaining wall may include a main retaining wall and a secondary retaining wall; the main retaining wall may be in contact with the opposite substrate of the flexible array substrate when the celling is formed, and the secondary retaining wall may define a gap is in a box at the opposite side substrate when the celling is formed, which may be provided on the main retaining wall or/and the gap as the notch.

To solve the above-mentioned problem, another technical scheme adopted by the present disclosure is to provide a flexible display panel. The flexible liquid crystal display panel may include an upper substrate, a lower substrate disposed opposite to the upper substrate, and a liquid crystal layer disposed between the upper substrate and the lower substrate. The lower substrate may be provided with a plurality of sub-pixel regions, and the retaining walls may be disposed around the sub-pixel regions. The retaining wall may be provided with at least one notch to allow the liquid crystals disposed in the plurality of sub-pixel regions to circulate when the flexible liquid crystal display panel is pressed and bent.

To solve the above-mentioned problem, another technical scheme adopted by the present disclosure is to provide a flexible display panel. The flexible liquid crystal display may include a flexible liquid crystal display panel as described above.

The beneficial effects of the present application may be: different from the related art, the present application discloses a flexible array substrate, a flexible liquid crystal display panel, and a flexible liquid crystal display. The flexible liquid crystal display panel may include an upper substrate, a lower substrate disposed opposite to the upper substrate, and a liquid crystal layer disposed between the upper substrate and the lower substrate. The lower substrate may be provided with a plurality of sub-pixel regions, and the retaining walls may be disposed around the sub-pixel regions. The retaining wall may be provided with at least one notch to allow the liquid crystals disposed in the plurality of sub-pixel regions to circulate when the flexible liquid crystal display panel is pressed and bent. By providing a notch on the closed retaining wall structure in the flexible liquid crystal display panel, the influence of the closed retaining wall structure on the diffusion of the liquid crystal and the alignment liquid during the liquid crystal drip irrigation or the alignment night coating is solved, and the display due to these factors is avoided. The generation of the dead pixels on the panel improves the yield of the display panel during celling process and the time for reducing the alignment of the ultraviolet light. The flexible liquid crystal display panel is easily pressed under the premise of not significantly deteriorating the anti-riot flow of the retaining wall. The liquid crystal molecules adjust the diffusion by themselves to ensure better display quality.

BRIEF DESCRIPTION OF THE DRAWINGS

In order to describe the technical solutions in the embodiments of the present application more clearly, the following briefly introduces the accompanying drawings required for describing the embodiments. Apparently, the accompanying drawings in the following description are merely some embodiments of the present application, for those skilled in the art, other drawings can be obtained based on these drawings without creative efforts.

DETAILED DESCRIPTION

The technical solutions in the embodiments of the present application are clearly and completely described below with reference to the accompanying drawings in the embodiments of the present application. Apparently, the described embodiments are merely a part but not all of the embodiments of the present application. All other embodiments obtained by a person of ordinary skill in the art based on the embodiments of the present invention without creative efforts shall fall within the protection scope of the present invention.

The terms "first", "second" and "third" in the present disclosure are merely for illustrative purposes, and should not be construed as indicating or implying the relative importance or the number of indicated technical features. Thus, features defined with "first", "second" and "third" may explicitly or implicitly include at least one of the features. In the description of the present disclosure, "a plurality of" or "multiple" means at least two, for example, two, three, etc., unless expressly limited. Moreover, the terms of "include", "have" and any variations thereof are intended to encompass the items listed thereafter and equivalents thereof as well as additional items. For example, a process, a method, a system, a product or a device that includes a series of steps or components is not limited to these steps or components already listed, but many optional steps or components not listed.

The term "embodiment" in the present disclosure indicates the specific feature, structure, or feature may be included in at least one embodiment of the present disclosure. The terms appear in the specification may not indicate the same embodiment, and may not indicate that the embodiment is independent from, alternative, or exclusive from other embodiments. The person skilled in the art may understand, the embodiment of the present disclosure may be combined with other embodiments.

In a flexible display panel, in particular, a flexible LCD (Liquid Crystal Display) or an OLED (Organic Light-Emitting Diode) display panel, the upper and lower substrate material is an organic plastic film such as flexible glass, polyimide (PI), polyethylene terephthalate (PET) or polydimethylsiloxane (PDMS), so that the display panel can be bent with different degrees in a single or any directions.

The retaining wall structure is one of the keys to ensuring better image quality for the flexible display panel. The retaining wall structure is generally designed as a unidirectional parallel or bidirectional cross-arranged structure for forming sub-pixels regions and isolating liquid crystals located within the sub-pixel regions. When the flexible display panel is bent, turbulent flow of liquid crystal between the sub-pixel regions can be avoided to ensure display quality.

However, the relatively closed retaining wall structure will affect the uniformity of the dispersion of the alignment solution and the liquid crystal filling during the celling process, and affect the display quality of the flexible display panel.

Figure 1:
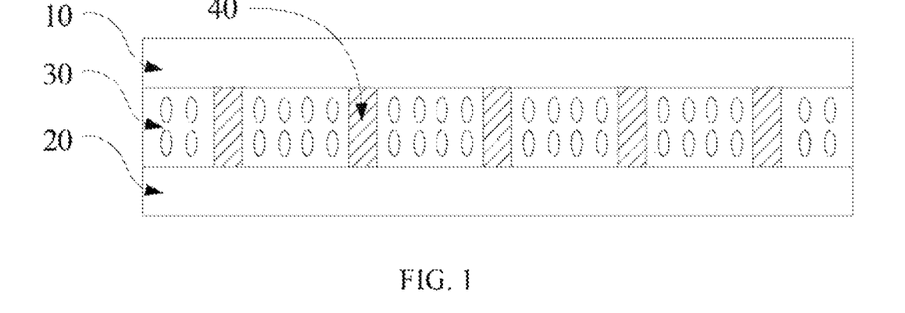
FIG. 1 is a schematic structural view of an embodiment of a flexible liquid crystal display panel provided by the present application.

Referring to FIG. 1, which is a schematic diagram of a flexible LCD panel according to an embodiment of the present disclosure.

The flexible LCD panel may include an upper substrate 10, a lower substrate 20, and a liquid crystal layer 30. The lower substrate 20 may be disposed opposite to the upper substrate 10, and the liquid crystal layer 30 may be disposed between the upper substrate 10 and the lower substrate 20. A plurality of sub-pixel regions 21 may be disposed on the lower substrate 20, and a retaining wall 40 may be disposed around the sub-pixel region 21. Each notch 41 may be defined in the retaining wall 40 such that the plurality of sub-pixel regions 21 can communicate with each other.

Alternatively, the retaining wall 40 may be a Black Photo Spacer (BPS). The retaining wall 40 may serve as both a Black Matrix (BM) and a Space Spacer (PS). The retaining wall 40 may be typically made of a stack of black photosensitive resin, multiple layers of different color filter layers, or other organic materials. For example, the material of the retaining wall 40 may be a red filter layer material, a blue filter layer material, a green filter layer material, or other materials. The liquid crystal display panel may generally include a pixel electrode layer and a common electrode layer. A region where the pixel electrode layer overlaps with the common electrode layer may be referred to as a driving region, and a region without a pixel electrode may be referred to as a non-driving region. The retaining wall 40 may be disposed at the non-driving area instead of the black matrix and the spacer.

Alternatively, the retaining wall 40 may be disposed on the upper substrate 10. For example, the upper substrate 10 may be a color film substrate. The upper substrate 10 may include a base substrate, and a filter layer and a common electrode layer sequentially disposed on the base substrate. The filter layer may be a red filter, a green filter, or a blue filter in each of the sub-pixel regions 21. The retaining wall 40 may be disposed between two adjacent ones. A notch 41 may be defined in the retaining wall 40. This application may only briefly describe the structure in which the retaining wall 40 is disposed on the upper substrate 10, and there may be other structures in which the plurality of retaining walls 40 are disposed on the upper substrate 10, which may be not limited in the embodiment.

Alternatively, the retaining wall 40 may be disposed on the lower substrate 20. For example, the lower substrate 20 may be an array substrate. The lower substrate 20 may include a base substrate, and a TFT structure, a protective layer, and a pixel electrode layer which are sequentially disposed on the base substrate. A plurality of TFT structures distributed in an array may be formed on the base substrate, and the plurality of TFT structures may include a plurality of thin film transistors and capacitor electrode lines. The capacitor electrode line may be a horizontally arranged scan line and a vertically disposed data line. The scan line and the data line may divide the base substrate into a plurality of sub-pixel regions 21 arranged in an array, and each of the sub-pixel regions 21 may be provided with a pixel electrode correspondingly. A protective layer may be disposed on the plurality of TFT structures. The retaining wall 40 may be disposed on a corresponding scan line or/and a data line region on the protective layer, and the pixel electrode layer may be disposed on a corresponding sub-pixel region on the protective layer. In one embodiment, a notch 41 may be defined in the retaining wall 40. In some embodiments, the filter layer may also be disposed on the lower substrate 20, specifically between the TFT structure and the pixel electrode layer. The present disclosure may only describe a structure of the retaining wall 40 disposed on the lower substrate 20 in brief, and there may be other structures in which a plurality of retaining walls 40 may be disposed on the lower substrate 20, which is not limited in this application.

The base substrate may be a flexible substrate such as a flexible glass, a polyimide substrate, a polyethylene terephthalate substrate, or a polydimethylsiloxane substrate.

The specific process of the flexible liquid crystal display panel in the present disclosure may be that a retaining wall 40 may be disposed on the upper substrate 10 or the lower substrate 20, an alignment film solution may be coated on the lower substrate 20, and pre-baking, solid baking, and alignment may be performed on the lower substrate 20. Then, a plastic frame may be formed on the lower substrate 20 to perform liquid crystal filling, and the upper substrate 10 and the lower substrate 20 may be subjected to a cell process, and then cut by a screen to form a flexible liquid crystal display panel.

Alternatively, the lower substrate 20 may include a plurality of data lines 22 and a plurality of scan lines 23. The plurality of data lines 22 and the plurality of scanning lines 23 may be arranged to intersect to form a plurality of sub-pixel regions 21. The retaining wall 40 may be disposed along the scan line 23 or the data line 22, and the retaining wall 40 may be defined with at least one notch 41. That is, the retaining wall 40 may be disposed on the upper substrate 10 or the lower substrate 20, which may be disposed corresponding to the position of the scanning lines 23 or the data lines 22 in the flexible LCD panel.

It can be understood that the retaining wall 40 may be disposed along the scan lines 23 or the data lines 22 in the same number as the sub-pixel area 21, through which the scan lines 23 or the data lines 22 pass. That is, the retaining wall 40 may penetrate the liquid crystal layer in the direction in which it is located. The retaining wall 40 may be defined with at least one notch 41, it being understood that the notch 41 can be clearly identified relative to the retaining wall 40. That is, the spacer support column should not be recognized as the retaining wall 40, and the space between the adjacent spacer support columns should not be recognized as the notch 41.

Figure 2:
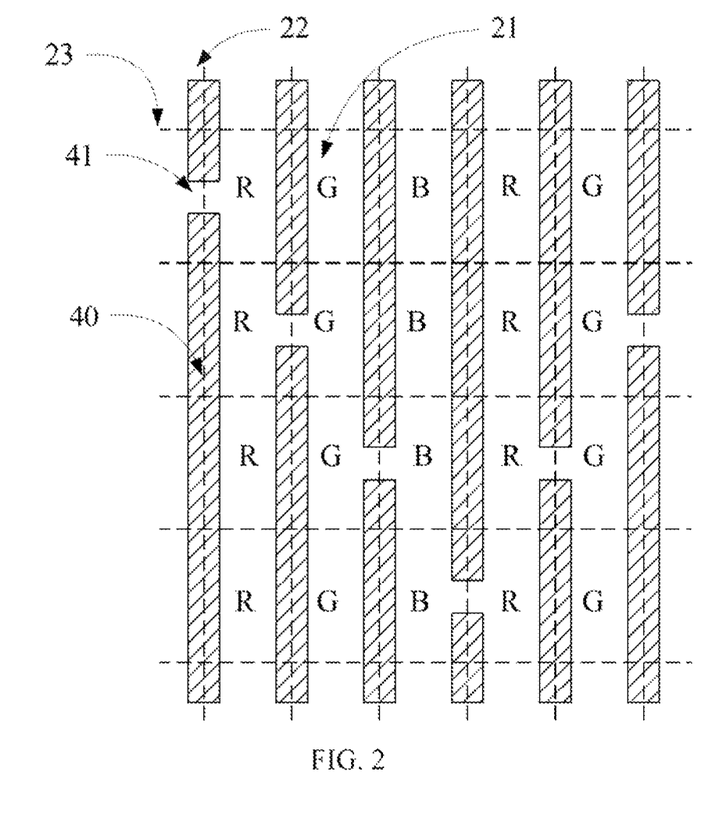
FIG. 2 is a schematic structural view of an embodiment of a retaining wall in the flexible liquid crystal display panel of FIG. 1.

Referring to FIG. 2, in an embodiment, the retaining wall 40 may be disposed along the data lines 22 only. Each retaining wall 40 may be provided with a notch 41, thereby ensuring that each sub-pixel region 21 can be interconnected and intercommunicated. For example, the plurality of retaining walls 40 may be arranged in parallel along the data lines 22, the notches 41 defined thereon may have the following irregularities. Each notch 41 on the retaining wall 40 may face a sub-pixel region 21, and the one on the next retaining wall 40 may face the diagonal one of the sub-pixel region 21. Alternatively, each notch 41 on the plurality of retaining walls 40 may be in a straight line, that is, the position of each notch 41 may be connected to the plurality of sub-pixel regions 21 of the same row. Since the retaining wall 40 is not disposed at the corresponding position of the scanning lines 23, the plurality of sub-pixel regions 21 of the same data line 22 path may be connected. Each of the retaining walls 40 may be provided with a notch 41. In the process of the liquid crystal panel, such as alignment liquid coating and liquid crystal filling process, the alignment liquid and the liquid crystal located in each sub-pixel region can flow with each other, so that the alignment liquid and the liquid crystal can be evenly distributed in each sub-pixel area. When the flexible liquid crystal display panel is pressed and bent, the liquid crystal molecules of each sub-pixel region 21 can be self-adjusted and diffused through the notches 41 to circulate with each other, so that the liquid crystals in different regions of the flexible liquid crystal display panel may be kept uniform in thickness to ensure better display quality.

Alternatively, the retaining wall 40 may also be disposed only along the scan lines 23. Each of the retaining walls 40 can be defined with a plurality of notches 41, and the position and number of the notches 41 can be adjusted according to actual conditions. It is only necessary to ensure that at least one notch 41 is defined in each of the retaining walls 40 to ensure fluidity between the sub-pixel regions 21.

Figure 3:
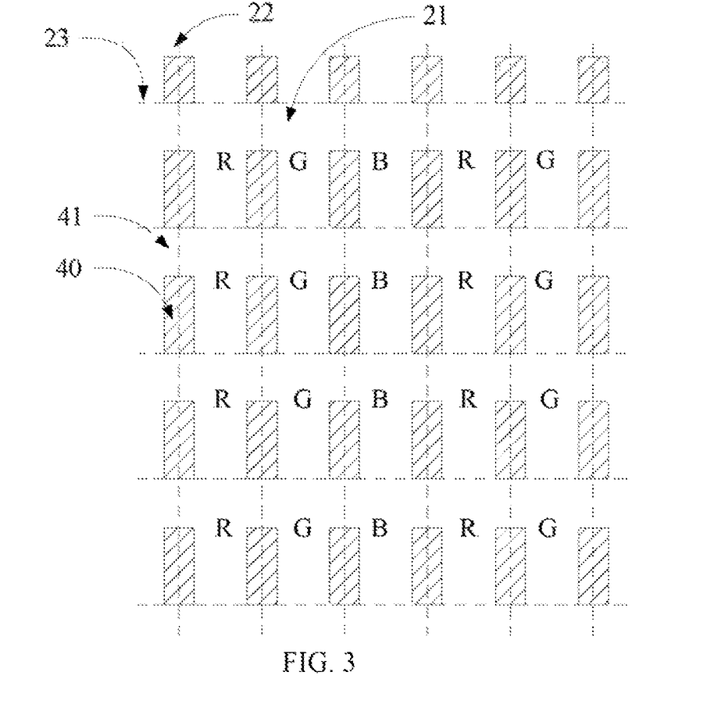
FIG. 3 is a schematic structural view of another embodiment of a retaining wall in the flexible liquid crystal display panel of FIG. 1.

Referring to FIG. 3, in another embodiment, the retaining wall 40 may be provided with a corresponding notch 41 for each sub-pixel region 21. For example, only a plurality of retaining walls 40 arranged in parallel along the data lines 22, the retaining wall 40 may be defined with a corresponding notch 41 for each sub-pixel region 21 of the path. The notches 41 on the adjacent retaining walls 40 corresponding to the same sub-pixel region 21 are located on the same scan line 23 such that the plurality of notches 41 are arranged in an array. The notches 41 can make the liquid crystals of the respective sub-pixel regions 21 flow more easily with each other. In the process of liquid crystal drip irrigation or alignment liquid coating, the notch 41 can make the liquid crystal or the alignment liquid flow evenly between the respective sub-pixel regions 21 to ensure the uniformity of the alignment liquid and the liquid crystal of each sub-pixel region 21. When the flexible liquid crystal display panel is pressed and bent, the notch 41 can facilitate the circulation of the liquid crystal of each sub-pixel region 21 to ensure uniformity of distribution of the liquid crystal in the flexible liquid crystal display panel, thereby maintaining good display quality.

Figure 4:
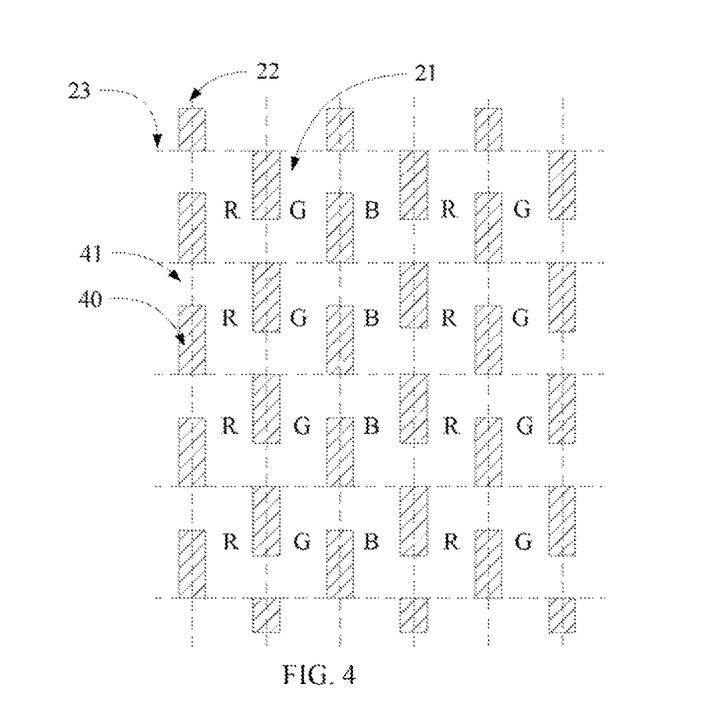
FIG. 4 is a schematic structural view of another embodiment of a retaining wall in the flexible liquid crystal display panel of FIG. 1.

Referring to FIG. 4, the retaining walls 40 may be only arranged in parallel along the data line 22, which is defined with a notch 40 for each sub-pixel region 21 of the path. The notches 41 on the adjacent retaining walls 40 corresponding to the same sub-pixel region 21 are staggered. Compared with the position of the notches 41 on the adjacent retaining wall 40 on the same scanning line 23, this manner can slow down the flow velocity of the liquid crystal molecules in the adjacent sub-pixel region 21, and increase the distance of the liquid crystal molecules flowing in the adjacent sub-pixel region 21, which is beneficial to increase the stability of the display quality of the flexible liquid crystal display panel. Of course, the arrangement of the above two kinds of notches can also be applied to a plurality of retaining walls 40 arranged only in parallel along the scanning lines 23.

Figure 5:
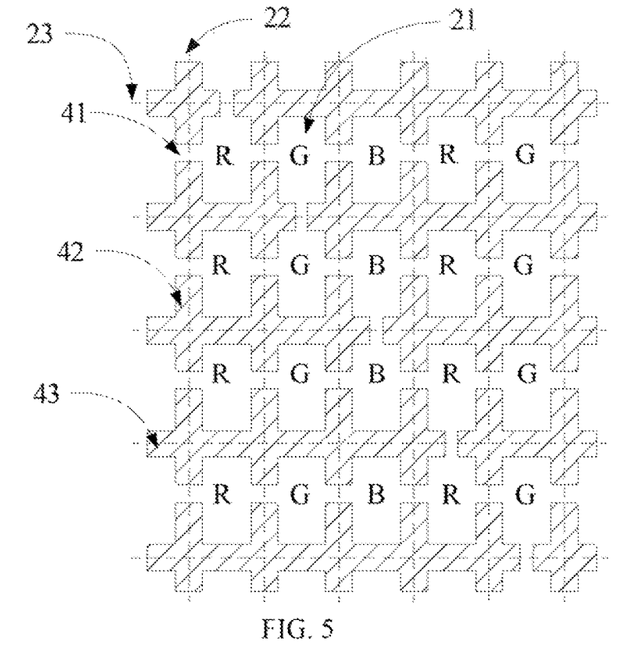
FIG. 5 is a schematic structural view of another embodiment of a retaining wall in the flexible liquid crystal display panel of FIG. 1.

Referring to FIG. 5, in another embodiment, a first retaining wall 42 may be disposed along the data lines 22, and a second retaining wall 43 may be disposed along the scan lines 23. One of the first retaining wall 42 and the second retaining wall 43 may be defined with notches 41 corresponding to each of the sub-pixel regions 21, and the other one is provided with at least one notch 41. For example, the first retaining wall 42 and the second retaining wall 43 may be arranged in a two-way cross arrangement along the data lines 22 and the scanning lines 23. The first retaining wall 42 arranged along the data lines 22 may define notches 41 corresponding to each sub-pixel region 21, and only one notch 41 may be defined in the second retaining wall 43 arranged along the scanning lines 23, thereby the alignment liquid and the liquid crystal in the plurality of sub-pixel regions 21 may have relatively higher fluidity in the direction along the scanning lines 23, and the alignment liquid and liquid crystal in the plurality of sub-pixel regions 21 can flow in the direction along the data lines 22. The liquid crystal molecules flowing in the direction of the data lines 22 may be more blocked with respect to the liquid crystal molecules flowing in the direction of the scanning lines 23, and thus have better stability with respect to the imaging quality of the aforementioned flexible liquid crystal display panel.

Figure 6:
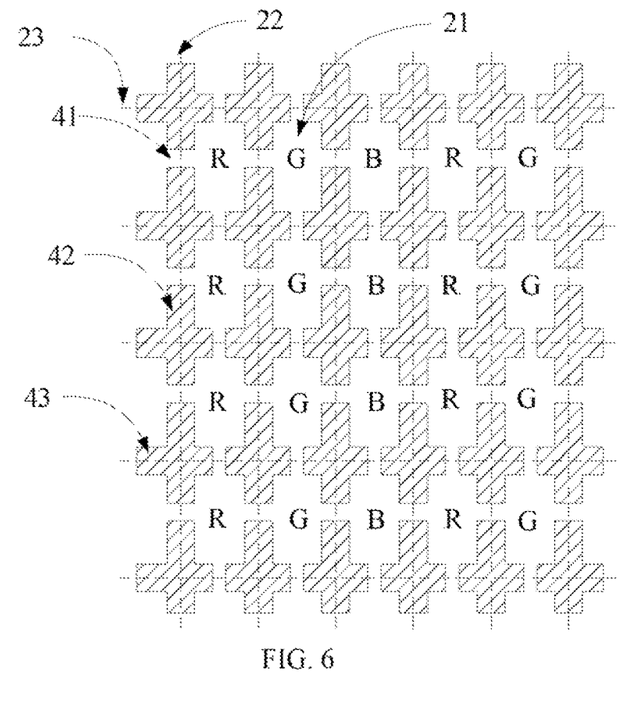
FIG. 6 is a schematic structural view of another embodiment of a retaining wall in the flexible liquid crystal display panel of FIG. 1.

Referring to FIG. 6, in another embodiment, the first retaining wall 42 and second retaining wall 43 corresponding to the sub-pixel regions 21 may define notches 41 to enhance the liquidity of the liquid crystals of each of the sub-pixel regions 21. At this time, by adjusting the size of the notches 41 on the first retaining wall 42 and the second retaining wall 43, the liquidity of the liquid crystal in each sub-pixel region 21 may be ensured, and the imaging quality of the flexible liquid crystal display panel in a curved state is also considered. That is, the fluidity of the liquid crystal of each sub-pixel region 21 should be limited to some extent.

Alternatively, the first retaining wall 42 may define notches 41 corresponding to each of the sub-pixel regions 21, and the second retaining wall 43 may define a plurality of notches 41. For example, the number of the notches 41 on the second retaining wall 43 may be three or five, which are not required to be corresponding to the respective sub-pixel regions 21. For example, the position of the notches 41 may be evenly disposed along the second retaining wall 43, or the position of the notches 41 of the adjacent second retaining wall 43 is misaligned.

Figure 7:
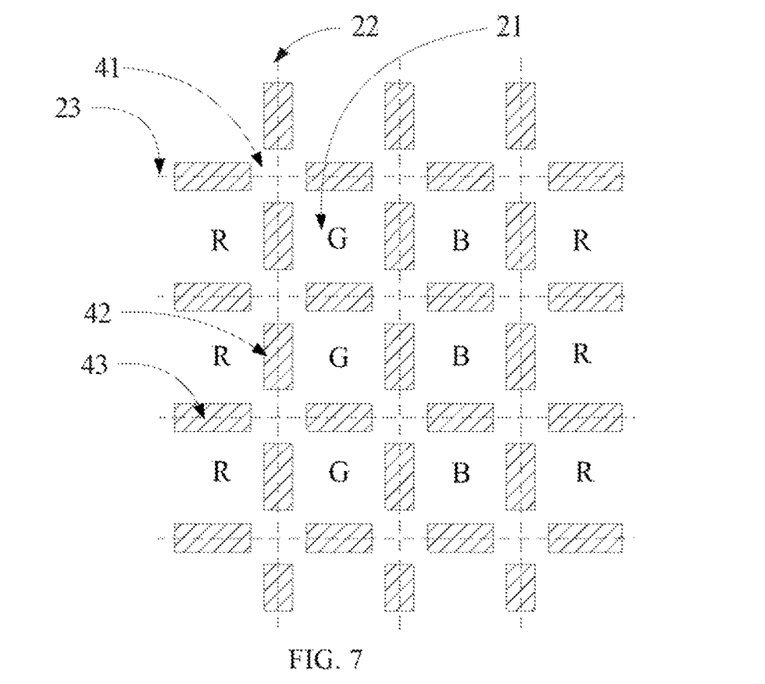
FIG. 7 is a schematic structural view of another embodiment of a retaining wall in the flexible liquid crystal display panel of FIG. 1.

Referring to FIG. 7, in another embodiment, the intersection of the first retaining wall 42 and the second retaining wall 43 may define notches 41, so that a sub-pixel region 21 can directly flow with the liquid crystals of the adjacent eight sub-pixel regions 21. While the liquid crystal is easily and sufficiently flowed in the sub-pixel section 21, the first retaining wall 42 and the second retaining wall 43 still have a buffering effect on the flow of the liquid crystal or the alignment liquid.

Figure 8:
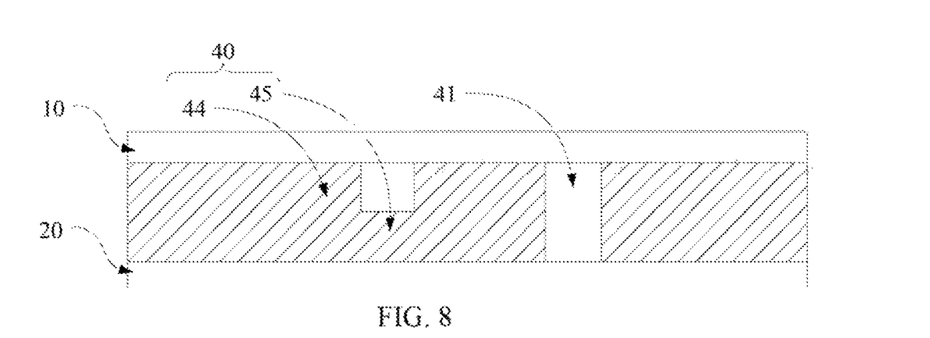
FIG. 8 is a schematic structural view of another embodiment of a retaining wall in the flexible liquid crystal display panel of FIG. 1.

Referring to FIG. 8, in another embodiment, the retaining wall 40 may include a main retaining wall 44 and a secondary retaining wall 45. The main retaining wall 44 may be in contact with both the upper substrate 10 and the lower substrate 20, and the secondary retaining wall 45 may be in contact with one of the upper substrate 10 and the lower substrates 20. The retaining wall 40 may be disposed on the upper substrate 10 or the lower substrate 20, that is, the main retaining wall 44 and the secondary retaining wall 45 are disposed on the upper substrate 10 or the lower substrate 20.

Alternatively, the secondary retaining wall 45 is provided at the position where the notches 41 located. The retaining wall 40 may an integral one including the main retaining wall 44 and the secondary retaining wall 45. Since the secondary retaining wall 45 has a gap with the upper substrate 10 or the lower substrate 20, the gap can serve as a notch 41 to connect adjacent sub-pixel regions 21. Furthermore, a part of the liquid crystal or the alignment liquid can flow to the adjacent sub-pixel region 21 through the gap, and a part of the liquid crystal or the alignment liquid may be blocked by the secondary retaining wall 45 from flowing to the adjacent sub-pixel region 21, thereby the uniformity of diffusion of the liquid crystal or the alignment liquid may be ensured, and the stability of the imaging quality of the flexible liquid crystal display panel is also facilitated. For example, when the notches 41 in each of the above embodiments are replaced by the secondary retaining wall 45, the time required for manufacturing the secondary retaining wall 45 with respect to the notch 41 on the retaining wall 40 is effectively shortened. For example, the notches 41 on the retaining wall 40 may be formed by a reticle process, and the gap height between the secondary retaining wall 45 and the upper substrate 10 or the lower substrate 20 is lower than that of the notch 41, and the use of the reticle process consumes less man-hours.

Figure 9:
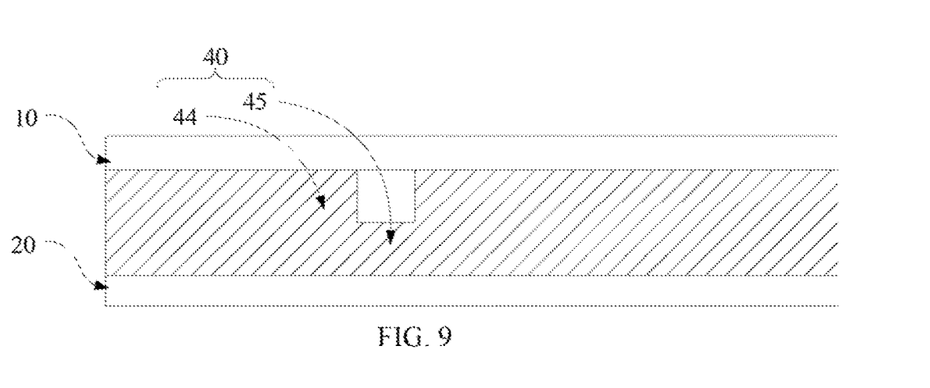
FIG. 9 is a schematic structural view of another embodiment of a retaining wall in the flexible liquid crystal display panel of FIG. 1.

Referring to FIG. 9, Alternatively, the secondary retaining wall 45 and the notches 41 are simultaneously disposed on the retaining wall 40. The retaining wall 40 may include a main retaining wall 44 and a secondary retaining wall 45. The main retaining wall 44 and the secondary retaining wall 45 are integral, and the notches 41 is disposed on the main retaining wall 44. Here, the notches 41, the main retaining wall 44, and the secondary retaining wall 45 are similar to those in the foregoing embodiment, and will not be described again.

Figure 10:
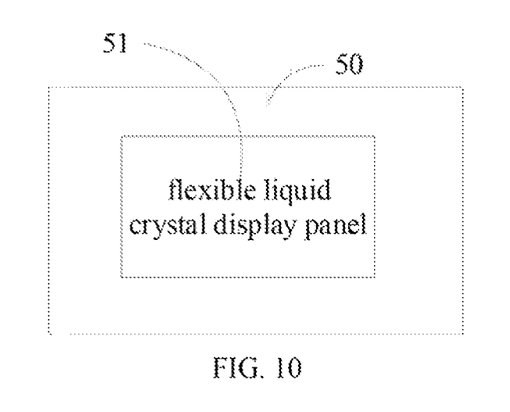
FIG. 10 is a schematic structural view of an embodiment of a flexible liquid crystal display provided by the present application.

Referring to FIG. 10, a schematic structural diagram of an embodiment of a flexible liquid crystal display provided by the present application.

The flexible liquid crystal display 50 may include a flexible liquid crystal display panel 51. The flexible liquid crystal display panel 51 may be a flexible liquid crystal display panel as described above, and details are not described herein.

Different from the related art, the present application discloses a flexible liquid crystal display panel and a flexible liquid crystal display. The flexible liquid crystal display panel may include an upper substrate, a lower substrate and a liquid crystal layer; a plurality of sub-pixel regions are disposed on the lower substrate, and a retaining wall may be disposed around the sub-pixel region, and the retaining wall may define notches to allow the plurality of sub-pixel regions to be located the liquid crystals circulate when the flexible liquid crystal display panels are bent. By providing a gap on the closed retaining wall structure in the flexible liquid crystal display panel, the influence of the closed retaining wall structure on the diffusion of the liquid crystal and the alignment liquid during the liquid crystal drip irrigation or the alignment night coating is solved, thereby avoiding the dead pixels on the display panel. The production of the display panel into a boxing and the time to help reduce the UV alignment. When the flexible liquid crystal display panel is pressed and bent, the liquid crystal liquid crystal molecules of each sub-pixel region 21 can be self-adjusted and diffused through the gaps to circulate, so that the liquid crystals in different regions of the flexible liquid crystal display panel are kept uniform in thickness to ensure better display quality.

Above are only embodiments of the disclosure is not patented and therefore limit the scope of the disclosure, the use of any content of the present specification and drawings made equivalent or equivalent structural transformation process, either directly or indirectly related to the use of other technologies areas are included in the same way the scope of the patent protection of the disclosure.

What is claimed is:

1. A flexible array substrate, comprising:
an upper substrate, and
a lower substrate disposed opposite the upper substrate;

wherein the upper substrate comprises:
a base substrate; and
a TFT structure, a protective layer, and a pixel electrode layer, which are sequentially disposed on the base substrate;
wherein the TFT structure comprises at least one thin film transistor, scan lines and data lines, which are electrically connected to the corresponding thin film transistors;
wherein a plurality of the scan lines and the data lines are disposed to intersect to form a plurality of sub-pixel regions, and a plurality of retaining walls are disposed around the sub-pixel regions, which are disposed along at least one of the scan lines and the data lines, each of the retaining walls define a plurality of notches so that the plurality of sub-pixel regions are connected with each other;
wherein at least one of the plurality of notches has a height less than the retaining walls;
wherein at least one of the plurality of notches is a through hole penetrating the retaining wall from the lower substrate to the upper substrate;
wherein each of the retaining walls is a black photo spacer.

2. The flexible array substrate according to claim 1, wherein the retaining wall comprises at least one first retaining wall and at least one second retaining wall, each first retaining wall is disposed along the data lines, and each second retaining wall is disposed along the scan lines; one of the first retaining walls and the second retaining walls defines notches corresponding to each of the sub-pixel regions, and the other one defines at least one notch.

3. The flexible array substrate according to claim 2, wherein each notch is defined in an intersection of the first retaining wall and the second retaining wall.

4. The flexible array substrate according to claim 2, wherein each notch is located in a position of an intersection of the first retaining wall and the second retaining wall.

5. A flexible liquid crystal display panel, comprising an upper substrate, a lower substrate disposed opposite the upper substrate, and a liquid crystal layer disposed between the upper substrate and the lower substrate;
wherein a plurality of sub-pixel regions are disposed on the lower substrate, and a plurality of retaining walls are disposed around the sub-pixel regions; each retaining wall defines at least one notch, so that liquid crystal molecules in the liquid crystal layer has fluidity between the plurality of sub-pixel regions;
wherein each of the retaining walls is a black photo spacer;
wherein
one of the at least one notch has a height less than the retaining walls;
one of the at least one notch is a through hole penetrating the retaining wall from the lower substrate to the upper substrate.

6. The flexible liquid crystal display panel according to claim 5, wherein the lower substrate comprises a plurality of scan lines and a plurality of data lines, and the plurality of scan lines and data lines are arranged to intersect to form a plurality of the sub-pixel area;
each retaining wall is disposed along at least one of the scan lines and the data lines and defines at least one of the notches.

7. The flexible liquid crystal display panel according to claim 6, wherein each retaining wall defines a corresponding notch in each of the sub-pixel regions.

8. The flexible liquid crystal display panel according to claim 7, wherein the notch positions of adjacent retaining walls corresponding to the same sub-pixel regions are the same.

9. The flexible liquid crystal display panel according to claim 7, wherein the notches are disposed offset from adjacent ones of the retaining walls corresponding to the same sub-pixel regions.

10. The flexible liquid crystal display panel of claim 9, wherein the lower substrate comprises a plurality of scan lines and a plurality of data lines; the plurality of scan lines and the data lines are arranged to intersect to form a plurality of the sub-pixel area; wherein each retaining wall comprises at least one first retaining wall and at least one second retaining wall, each first retaining wall is disposed along the data lines, and each second retaining wall is disposed along the scan lines; one of the first retaining walls and the second retaining walls define notches corresponding to each of the sub-pixel regions, and the other one is provided with at least one notch.

11. The flexible liquid crystal display panel according to claim 10, wherein the notches are provided at an intersection of the first retaining walls and the second retaining walls.

12. The flexible liquid crystal display panel according to claim 5, wherein the secondary retaining wall is provided at the position where the notches located.

13. A flexible liquid crystal display, comprising a flexible liquid crystal display panel;
the flexible liquid crystal display panel comprises an upper substrate, a lower substrate disposed opposite the upper substrate, and a liquid crystal layer disposed between the upper substrate and the lower substrate;
a plurality of sub-pixel regions are disposed on the lower substrate, and a plurality of retaining walls are disposed around the sub-pixel region, and each retaining wall defines at least one notch so as to have fluidity between the plurality of sub-pixel regions;
wherein each of the retaining walls is a black photo spacer;
wherein
one of the at least one notch has a height less than the retaining walls;
one of the at least one notch is a through hole penetrating the retaining wall from the lower substrate to the upper substrate.

14. The flexible liquid crystal display panel according to claim 13, wherein the lower substrate comprises a plurality of scan lines and a plurality of data lines, and the plurality of scan lines and data lines are arranged to intersect to form a plurality of the sub-pixel area;
each retaining wall is disposed along at least one of the scan lines and the data lines and defines at least one of the notches.

15. The flexible liquid crystal display panel according to claim 14, wherein each retaining wall defines a corresponding notch in each of the sub-pixel regions.

16. The flexible liquid crystal display panel of claim 13, wherein the lower substrate comprises a plurality of scan lines and a plurality of data lines; the plurality of scan lines and the data lines are arranged to intersect to form a plurality of the sub-pixel area; wherein the retaining wall comprises at least one first retaining wall and at least one second retaining wall, each first retaining wall is disposed along the data lines, and each second retaining wall is disposed along the scan lines; one of the first retaining walls and the second retaining walls define notches corresponding to each of the sub-pixel regions, and the other one is provided with at least one notch.

17. The flexible liquid crystal display panel according to claim 16, wherein the notches are provided at an intersection of the first retaining wall and the second retaining wall.

18. The flexible liquid crystal display panel according to claim 13, wherein the secondary retaining wall is provided at the position where the notches located.

\* \* \* \* \*